United States Patent
Lee et al.

(10) Patent No.: US 7,906,169 B2
(45) Date of Patent: Mar. 15, 2011

(54) ORGANIC LIGHT EMITTING DEVICE AND METHOD OF MANUFACTURING THE SAME

(75) Inventors: Tae-Woo Lee, Seoul (KR); Sang-Yeol Kim, Gwacheon-si (KR); Mu-Gyeom Kim, Hwaseong-si (KR); Yu-Jin Kim, Suwon-si (KR); Lyong-Sun Pu, Suwon-si (KR); Jong-Jin Park, Guri-si (KR); Sang-Hoon Park, Seongnam-si (KR); In-Nam Kang, Ansan-si (KR)

(73) Assignee: Samsung Mobile Display Co., Ltd., Nongseo-Dong, Giheung-Gu, Yongin, Gyunggi-Do (KR)

( * ) Notice: Subject to any disclaimer, the term of this patent is extended or adjusted under 35 U.S.C. 154(b) by 1210 days.

(21) Appl. No.: 11/340,597

(22) Filed: Jan. 27, 2006

(65) Prior Publication Data
US 2006/0170337 A1     Aug. 3, 2006

(30) Foreign Application Priority Data
Feb. 3, 2005   (KR) .................. 10-2005-0010178

(51) Int. Cl.
 B05D 5/06   (2006.01)
 B05D 3/02   (2006.01)
(52) U.S. Cl. .......................................... 427/66; 427/384
(58) Field of Classification Search .................. 427/66, 427/384
See application file for complete search history.

(56) References Cited

U.S. PATENT DOCUMENTS

| | | | |
|---|---|---|---|
| 5,247,190 A | 9/1993 | Friend et al. | |
| 6,830,494 B1 * | 12/2004 | Yamazaki et al. | 445/24 |
| 2001/0001050 A1 * | 5/2001 | Miyashita et al. | 428/690 |
| 2002/0113241 A1 * | 8/2002 | Kubota et al. | 257/79 |
| 2002/0139303 A1 * | 10/2002 | Yamazaki et al. | 118/719 |
| 2002/0155632 A1 * | 10/2002 | Yamazaki et al. | 438/29 |
| 2003/0012869 A1 * | 1/2003 | Kido | 427/58 |
| 2004/0247934 A1 * | 12/2004 | Takeuchi et al. | 428/690 |
| 2004/0262617 A1 * | 12/2004 | Hahm et al. | 257/79 |
| 2005/0012451 A1 * | 1/2005 | Yuki et al. | 313/504 |

(Continued)

FOREIGN PATENT DOCUMENTS

CN     1366015     8/2002

(Continued)

OTHER PUBLICATIONS

Lee et al.; "Improvement of EL efficiency in polymer light-emitting diodes by heat treatments"; Synthetic Metals 117 (2001) 249-251.*

(Continued)

*Primary Examiner* — Timothy H Meeks
*Assistant Examiner* — James Lin
(74) *Attorney, Agent, or Firm* — Robert E. Bushnell, Esq.

(57) ABSTRACT

An organic light emitting device and a method of manufacturing the same, the organic light emitting device includes a first electrode, a second electrode, and an organic layer that has at least a multi-coated emissive layer and which is interposed between the first and second electrodes. The multi-coated emissive layer is a single layer composed of a neutral emissive material and an $n_o-n_e$ parameter of the emissive layer is greater than an $n_o-n_e$ parameter of a single-coated layer. The organic light emitting device has a longer lifetime and high efficiency.

22 Claims, 13 Drawing Sheets

U.S. PATENT DOCUMENTS

2005/0170737 A1\* 8/2005 Seo et al. ........................ 445/24
2005/0276910 A1\* 12/2005 Gupta ............................. 427/66

FOREIGN PATENT DOCUMENTS

| | | |
|---|---|---|
| EP | 1459125 | 9/2004 |
| KR | 1020030001623 | 1/2003 |
| KR | 1020040070561 | 8/2004 |
| KR | 1020040081528 | 9/2004 |

OTHER PUBLICATIONS

Jinhan Cho et al., "Fabrication of Highly Ordered Multilayer Films Using a Spin Self-Assembly Method", Advanced Materials, (2001), 13, No. 14, p. 1076.
Registration Determination Certificate from from Chinese Intellectual property Office issued in Applicant's corresponding Chinese Patent No. 200610006798.6 dated Sep. 23, 2009.

\* cited by examiner

ORGANIC LIGHT EMITTING DEVICE AND METHOD OF MANUFACTURING THE SAME

CROSS-REFERENCE TO RELATED PATENT APPLICATIONS AND CLAIM OF PRIORITY

This application claims the benefit of Korean Patent Application No. 10-2005-0010178, filed on Feb. 3, 2005, in the Korean Intellectual Property Office, the disclosure of which is incorporated herein in its entirety by reference.

BACKGROUND OF THE INVENTION

1. Field of the Invention

The present invention relates to an organic light emitting device and a method of manufacturing the same, and more particularly, to an organic light emitting device including an emissive layer, of which an $n_o-n_e$ parameter is greater than an $n_o-n_e$ parameter of a single-coated emissive layer where $n_o$ is an ordinary refractive index and $n_e$ is a extraordinary refractive index and a method of manufacturing the same.

2. Description of the Related Art

Organic light emitting devices (OLEDs) are self-emissive devices that emit light by combination of electron and holes in a fluorescent or phosphorescent organic layer when an electric field is supplied to the organic layer. OLEDs are lightweight, have simple structures, produce high-quality color images with wide viewing angles, and can be easily manufactured. In addition, OLEDs can produce moving images with high color purity at a low operating voltage and using low power consumption. Due to these characteristics, OLEDs are suitable for portable electronic devices.

OLEDs are divided into small molecular OLEDs (SMOLEDs) and polymer OLEDs (PLEDs) according to the molecular weight of an emissive layer forming material.

In SMOLEDs, an organic layer including at least an emissive layer may have a multi-layer structure by further including a hole injection layer, a hole transport layer, an electron transport layer, and/or an electron injection layer to allow holes and electrons to efficiently flow. These layers can be manufactured by vacuum thermal deposition, organic vapor jet deposition, organic vapor phase deposition or the like. In this case, however, materials for forming these layers are inefficiently used, and thus, the manufacturing costs increase. In addition, proper deposition equipments for producing large screens have not been developed.

On the other hand, an organic layer interposed between first and second electrodes of a PLED has higher mechanical strength and better thermal stability than that of a SMLED. In addition, PLEDs operate at low voltage and can emit various emission colors according to the structure of an emission polymer. The organic layer of the PLEDs can be formed by spin casting, ink jet printing, nozzle printing or spray printing an emissive polymer dissolved in an organic solvent. Therefore, research on PLEDs and methods of manufacturing the same are actively conducted.

U.S. Pat. No. 5,247,190 discloses a light emitting device comprising a poly(p-phenylenevinylene) (PPV)-based polymer film. In this case, a phenylene ring of the PPV-based film contains at least one substituent selected from an alkyl group (preferably, methyl group), an alkoxy group (preferably, methoxy group or an ethoxy group), halogen (preferably, Cl or Br), and a nitro group. In this patent, the PPV-based polymer film was formed by repeating a unit process, the unit process including: spin coating an ionic group-containing PPV precursor dissolved in an organic solvent, such as methanol, on a predetermined substrate: and heat treating the result to form an insoluble thin film. As a result, a multilayer including the insoluble thin film is formed.

A method of forming layers by spin self-assembly was disclosed at Cho et al. Adv. Mater. (2001), 13, p 1076. However, this method can be applied only to a polymer containing an ionic group, and the thickness of a single-coated layer obtained from the method is in the range of as little as 1 nm to 2 nm. Accordingly, when an organic layer of a PLED is formed using this method, a manufacturing time is long and manufacturing costs are high.

As described above, when an organic layer, in particular, an emissive layer interposed between first and second electrodes is formed using conventional methods, characteristics of the organic layer do not meet a required standard.

SUMMARY OF THE INVENTION

The present invention provides an organic light emitting device including an emissive layer, of which an $n_o-n_e$ parameter is greater than an $n_o-n_e$ parameter of a single-coated emissive layer where $n_o$ is an ordinary refractive index and $n_e$ is a extraordinary refractive index and a method of manufacturing the same.

According to an aspect of the present invention, there is provided an organic light emitting device including: a first electrode; a second electrode; an organic layer that includes at least a multi-coated emissive layer and which is interposed between the first and second electrodes, wherein the multi-coated emissive layer is a single layer composed of a neutral emissive material and an $n_o-n_e$ parameter of the multi-coated emissive layer is greater than an $n_o-n_e$ parameter of a single-coated layer where $n_o$ is an ordinary refractive index and $n_e$ is a extraordinary refractive index.

According to still an aspect of the present invention, there is provided an organic light emitting device including a first electrode, a second electrode, an organic layer having an emissive layer interposed between the first electrode and the second electrode, the emissive layer formed by applying at least twice a mixture of a neutral emissive material and an organic solvent.

According to another aspect of the present invention, there is provided a method of manufacturing an organic light emitting device, the method including applying at least twice a solution of a neutral (i.e. non-ionic) emissive material dissolved in an organic solvent to a substrate on which an emissive layer of the organic light emitting device is to be formed.

According to still another aspect of the present invention, there is provided a method of manufacturing an organic light emitting device, the method including: (a) coating a first solution of a first neutral emissive material in a first organic solvent on a substrate on which an emissive layer of the organic light emitting device is to be formed; (b) heat treating the result; and (c) coating a second solution of a second neutral emissive material in a second organic solvent on the heat treated result, wherein operation (b) and operation (c) are repeated.

According to yet another aspect of the present invention, there is provided organic light emitting devices manufactured using the described methods.

The organic light emitting device includes a multiple emissive layer having a greater $n_o-n_e$ parameter than that of a single-coated emissive layer so that long lifetime and high efficiency can be obtained. The organic light emitting device can be manufactured using a method of manufacturing an organic light emitting device according to the present invention.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
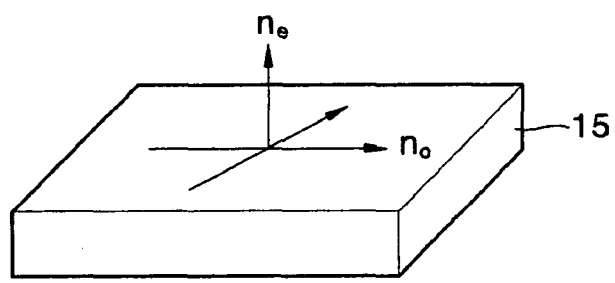
FIG. 1 is a view illustrating directions of refractive indices $n_e$ and $n_o$.

An organic light emitting device (OLED) according to an embodiment of the present invention includes a first electrode, a second electrode, and an organic layer including at least an emissive layer. The emissive layer is a single layer composed of a neutral emissive material, and an $n_o-n_e$ parameter of the emissive layer is greater than an $n_o-n_e$ parameter of a single-coated emissive layer.

The emissive layer does not substantially have defects, such as pinholes that may be formed when a thin layer is formed by coating. Furthermore, a neutral emissive material of the emissive layer has excellent orientation and high density.

In the present specification, the term 'single-coated emissive layer' is used to define the $n_o-n_e$ parameter of the multi-coated emissive layer. The term 'single-coated emissive layer' indicates a layer formed by single-coating the solution of a neutral emissive material dissolved in an organic solvent on a substrate, on which an emissive layer is to be formed. The multi-coated emissive layer of the OLED according to an embodiment of the present invention and the single-coated emissive layer are formed using the same neutral emissive materials, the same organic solvents, and the same substrates such that the single-coated emissive layer and the multi-coated emissive layer have the same or similar thicknesses. In other words, the term 'single-coated emissive layer' indicates an emissive layer that is formed by coating once, whereas the term 'multi-coated emissive layer' indicates an emissive layer that is formed by coating two or more. The single-coated emissive layer is used to compare its $n_o-n_e$ parameter with that of the emissive layer according to an embodiment of the present invention. When the $n_o-n_e$ parameter of the multi-coated emissive layer is compared with the $n_o-n_e$ parameter of the single-coated emissive layer, it is assumed that the single-coated emissive layer is composed of the same neutral material as the multi-coated emissive layer, and has the same or similar thickness as the multi-coated emissive layer. Accordingly, the definition of 'single-coated emissive layer' can vary according to the neutral emissive material for the multi-coated emissive layer.

Although the multi-coated emissive layer and the single-coated emissive layer are composed of the same neutral emissive materials and have the same or similar thicknesses, these neutral emissive materials have different orientations and densities. The inventors of the present invention use $n_o-n_e$, (refractive index anisotropy) where $n_o$ is an ordinary refractive index of the emissive layer or the single-coated emissive layer and $n_e$ is a extraordinary refractive index of the emissive layer or the single-coated emissive layer, as a parameter indicating the difference of molecular dipole orientations and densities of these neutral emissive materials between in plane and out of plane.

The $n_o-n_e$ parameter can be measured using spectroscopic ellipsometry. Ellipsometry is an optical technique using polarized light that is transmitted or reflected from a sample because the polarized light varies depending on the refractive index of a medium. In particular, spectroscopic ellipsometry is a technique for measuring an optical constant spectrum of a wide wavelength region.

When spectroscopic ellipsometry is performed using the emissive layer and the single-coated emissive layer, two or three angles, delta ($\Delta$) and pi ($\Psi$) can be obtained. From these results, a real part and an imaginary part of a complex dielectric function (or, complex refractive index) can be obtained. From the complex dielectric function, various optical constants, such as a refractive index n, that can be used to find a transition structure between energy bands of electrons in a material can be obtained. The refractive index n can be measured using Maxwell's equation, Snell's rule, or a refractive index of Fresnel all of which are well known to those of ordinary skill in the art.

Refractive indices n of the multi-coated emissive layer and the single-coated emissive layer can be obtained using $n_o$ where o indicates 'ordinary plane' and $n_e$ where e indicates 'extraordinary plane'. Directions of $n_o$ and $n_e$ are illustrated in FIG. 1. Referring to FIG. 1, $n_e$ is a refractive index in a direction that is perpendicular to an upper surface of a layer 15, and $n_o$ is a refractive index in a direction that is parallel to the upper surface of the layer 15.

The $n_o-n_e$ parameter of the multi-coated emissive layer is greater than that of the single-coated emissive layer because neutral emissive materials for forming the multi-coated emissive layer and the single-coated emissive layer have different orientations and densities. This will be described in detail with reference to FIGS. 2A, 2B, 3A, and 3B.

Figure 2A:
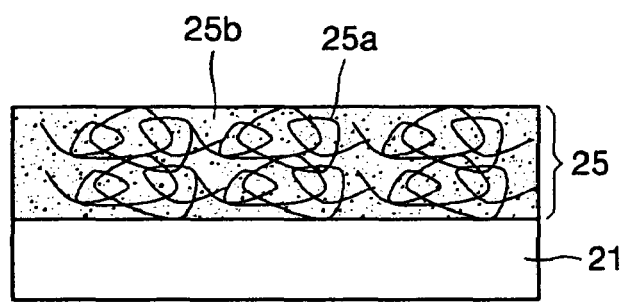
FIGS. 2A and 2B are views illustrating an orientation and density of a neutral emissive material of a single-coated emissive layer.

Referring to FIG. 2A, a coating layer 25 is formed by coating a mixed solution of a neutral emissive material 25a and an organic solvent 25b on a predetermined substrate 21. Molecules of the neutral emissive material 25a of the coating layer 25 are tangled. In addition, molecules of the neutral emissive material 25a are separated from each other by relatively big gaps so that the density of the neutral emissive material is relatively low.

Figure 2B:
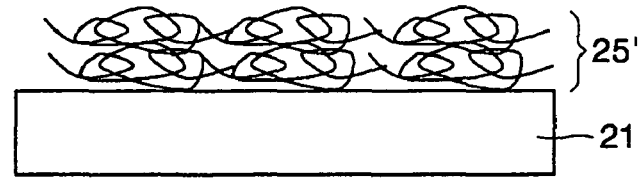

The single-coated emissive layer 25 is heat treated to form a heat treated single-coated emissive layer 25' (see FIG. 2B). Referring to FIG. 2B, the organic solvent 25b is not illustrated because almost all of the organic solvent 25b is removed by heat treatment. The heat treated single-coated emissive layer 25' has an orientation of tangled molecules and has a low density.

Figure 3A:
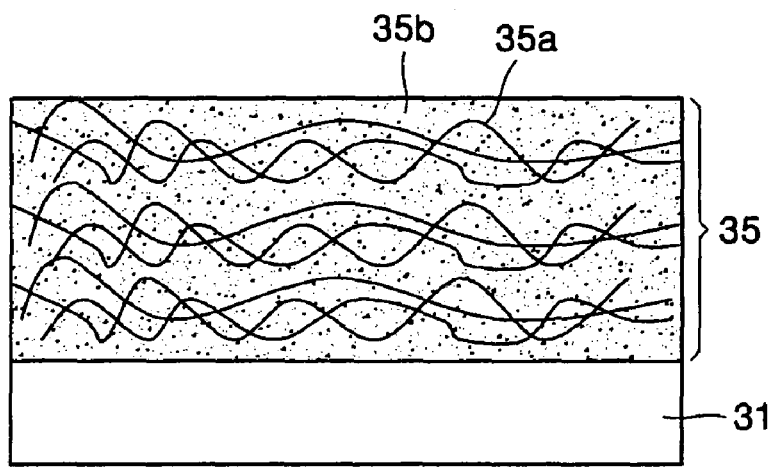
FIGS. 3A and 3B are views illustrating an orientation and density of a neutral emissive material of an emissive layer according to an embodiment of the present invention.

FIG. 3A illustrates a coating layer 35 formed by multicoating a mixed solution of a neutral emissive material 35a and an organic solvent 35b on a predetermined substrate 31. The neutral emissive material 35a of the coating layer 35 is untangled. In addition, molecules of the neutral emissive material 35a are very closely located to each other so that the neutral emissive material 35a has a high density in the horizontal direction.

Figure 3B:
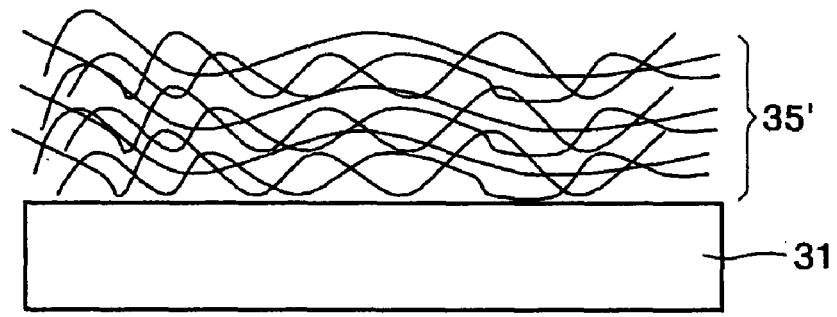

The coating layer 35 is heat treated to form a heat treated emissive layer 35' (see FIG. 3B). Referring to FIG. 3B, the organic solvent 35b is not illustrated because almost all of the organic solvent 35b is removed by heat treatment. The heat treated emissive layer 35' has an excellent orientation and has a high density.

The orientations and densities of the emissive layer and the single-coated emissive layer can be represented using the $n_o$, $n_e$ parameter, and the $n_o-n_e$ parameter. An increase of $n_o$ indicates that the density of a horizontal portion of the neutral emissive material increases, because no is an ordinary refractive index. An increase of $n_e$ indicates that the density of a vertical portion of the neutral emissive material increases, because $n_e$ is an extraordinary refractive index. An increase of the $n_o-n_e$ parameter indicates that the orientation of the neutral emissive material in the horizontal direction is improved. When molecules of the neutral emissive material are tangled, the density of the polymer chain in the vertical direction increases, and thus, $n_e$ increases.

The $n_o-n_e$ parameter of the emissive layer may be greater than that of the single coated emissive layer by 0.001 to 0.2, preferably, 0.005 to 0.05. When the $n_o-n_e$ parameter of the emissive layer is greater than that of the single coated emissive layer by less than 0.001, the lifetime and efficiency of the OLED may not be satisfied. The difference between the $n_o-n_e$ parameter of the multi-coated emissive layer and the $n_o-n_e$ parameter of the single coated emissive layer cannot be greater than 0.2 when the same materials are used in the emissive layer and the single coated emissive layer.

The emissive layer of the OLED according to an embodiment of the present invention is a single layer. That is, even when the emissive layer is formed using a multi-coating process, or a repeatable process of coating and heat treatment, or the emissive layer is composed of at least two different neutral emissive materials, the emissive layer is observed as a single layer, not a multilayer.

The emissive layer may be composed of a neutral emissive material. The neutral emissive material is electrically neutral because it does not contain a moiety inducing an electrically positive or negative state. The moiety can be an ionic group. Conventional emission materials having this property can be used in the present embodiment.

The neutral emissive material may be, but is not limited to, polyphenylenevinylene (PPV)-based polymer and a derivative thereof, a poly(p-phenylene)(PPP)-based polymer and a derivative thereof, a polythiophene(PT)-based polymer and a derivative thereof, a polyfluroene(PF)-based polymer and a derivative thereof, a polyspirofluorene (PSF)-based polymer and a derivative thereof, or the like, preferably, the PF-based polymer and a derivative thereof. In detail, the neutral emissive material that forms the emissive layer may be, but is not limited to, poly(2-methoxy-5-(2-ethylhexyloxy)-1,4-phenylnenvinylene (MEH-PPV), CN-PPV that contains —CN having a strong electron affinity, conjugated-nonconjugated multiblock copolymer (CNMBC) having PPV with a uniform conjugated length, poly(3-alkyl-thiophene (PAT), a 9-alkylfluorene based polymer, 9,9-dialkyl-fluorene based polymer, a spirofluorene based polymer, or the like.

The emissive layer may be composed of a single neutral emissive material, or at least two different emissive materials.

The neutral emissive material may contain a blue emissive material having an energy band gap of 2.41 eV to 2.80 eV, a green emissive material having an energy band gap of 2.21 eV to 2.40 eV, or a red emissive material having an energy band gap of 1.90 eV to 2.20 eV. The blue emissive material may be, but is not limited to, poly-(2,7(9,9'-di-n-octylfluorene)-(1,4-phenylene-((4-sec-buthylphenyl)imino)-1,4-phenylene)) (TFB). The green emissive material may be, but is not limited to, poly (2,7(9,9'-di-n-octyl fluorene)-3,6-benzothiadiazole (F8BT). The red emissive material may be, but is not limited to, MEH-PPV.

The emissive layer may comprise a single neutral emissive material, or at least two different neutral emissive materials having different energy band gaps. An emissive layer composed of at least two different neutral emissive materials can produce light with high color purity through an energy band gap modulation. When the emissive layer comprises at least two different neutral emissive materials, a neutral emissive material with a lower energy band gap can be positioned closer to the first electrode. Alternatively, a neutral emissive material with a higher energy band gap can be positioned closer to the first electrode. When the green emissive material, the blue emissive material, and the red emissive material are used, a white light emitting device can be obtained.

The thickness of the emissive layer may be in the range of 30 nm to 200 nm, preferably, 50 nm to 100 nm, more preferably, 60 nm to 80 nm. When the emissive layer has a thickness less than 30 nm, a leakage current increases and the efficiency and lifetime of the device decrease. When the emissive layer has a thickness greater than 200 nm, a driving voltage can be increased.

The OLED according to an embodiment of the present invention may further include, in addition to the emissive layer, at least one layer selected from a hole injection layer, a hole transport layer, a hole blocking layer, an electron transport layer, and an electron injection layer. The hole injection layer, the hole transport layer, the hole blocking layer, the electron transport layer, and the electron injection layer may be composed of commonly used materials. In addition, the thicknesses of these layers are commonly known. Korean Patent No. 0424090, and Korean Laid-open Patent Nos. 2004-0081528 and 2004-0070561 can be incorporated herein by reference.

The hole transport layer may be a compound comprising a carbazole group and/or an arylamine group which can transport holes. However, the hole transport forming material is not limited thereto. In detail, the hole transport layer may be composed of at least one compound selected from 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 4,4',4''-tri(N-carbazolyl)triphenylamine, 1,3,5-tri(2-carbazolylphenyl)benzene, 1,3,5-tris(2-carbazolyl-5-metoxyphenyl)benzene, bis(4-carbazolylphenyl)silane, N,N'-bis(3-methylphenyl)-N,N'-diphenyl-[1,1-biphenyl]-4,4'diamine(TPD), N,N'-di(naphthalene-1-yl)-N,N'-diphenyl benzidine(α-NPD), N,N'-diphenyl-N,N'-bis(1-naphthyl)-(1,1'-biphenyl)-4,4'-diamine(NPB), IDE320 (Idemitsu Kosan Co., Ltd.), poly(9,9-dioctylfluorene-co-N-(4-butylphenyl)diphenylamine (TFB) and poly(9,9-dioctylfluorene-co-bis-(4-butylphenyl-bis-N,N-phenyl-1,4-phenylenediamin)) (PFB). However, the hole transport forming material is not limited thereto.

A method of manufacturing an OLED according to another embodiment of the present invention will now be described. The method includes applying at least twice a mixed solution of a neutral emissive material and an organic solvent to a substrate, on which an emissive layer is to be formed. The emissive layer formed using the method does not have defects, such as pinholes that can be easily formed when a thin layer is formed by coating. In the present embodiment, heat treatment is not used between coating processes. That is, only coating is performed several times so that intermixing occurs between an upper layer and a lower layer. Due to the intermixing, the lower layer has fewer pinholes.

The coating process may be performed, for example, two, three, or four times. The number of coatings is dependent on manufacturing costs and time.

The neutral emissive material has already been described in detail.

The organic solvent may include at least one organic solvent selected from organic solvents with a Hansen solubility parameter of 16 to 24, and preferably, 18 to 21. When the Hansen solubility parameter of an organic solvent is less than 16, the neutral emissive material is not sufficiently dissolved. When the Hansen solubility parameter of an organic solvent is greater than 24, a pre-coated layer can be dissolved too much when coating is repeated so that it is difficult to form an emissive layer with a predetermined thickness. In addition, the organic solvent may include at least two organic solvents selected from organic solvents with a Hansen solubility parameter of the above range.

A hydrogen bonding component constant of Hansen solubility parameter of the organic solvent may be in the range of 1 to 10, preferably, 1 to 5 because the organic solvent can be bonded to a hydrocarbon-containing polymer through hydrogen bonding. When the hydrogen bonding component constant is less than 1, the neutral emissive material is not sufficiently dissolved. When the hydrogen bonding component constant is greater than 10, a previously-coated layer can be dissolved too much when coating is repeated so that it is difficult to form an emissive layer with a predetermined thickness. Organic solvents that can be used in the present invention, Hansen solubility parameters of the organic solvents, and hydrogen bonding component constants of the Hansen solubility parameters are shown in Table 1.

TABLE 1

| Organic Solvent | Hansen Solubility Parameter | Hydrogen bonding component constant of the Hansen Solubility Parameter |
| --- | --- | --- |
| Benzene | 18.6 | 2.0 |
| Chlorobenzene | 19.4 | 8.4 |
| Toluene | 18.2 | 2.0 |
| Xylene | 18.1 | 2.0 |
| o-xylene | 18.0 | 3.1 |

TABLE 1-continued

| Organic Solvent | Hansen Solubility Parameter | Hydrogen bonding component constant of the Hansen Solubility Parameter |
| --- | --- | --- |
| 1,2-dichloroethane | 20.0 | 4.1 |
| 1,1-dichloroethylene | 18.8 | 4.5 |
| trichloroethane | 23.2 | 5.3 |
| Chloroform | 18.7 | 6.3 |

The organic solvent may include toluene, xylene, or both of these.

When an OLED is manufactured using at least two organic solvents having different Hasen solubility parameters, the coating sequence of these organic solvents may vary. For example, among at least two organic solvents, an organic solvent with the smallest Hansen solubility parameter can be coated first. For example, when a substrate, on which an emissive layer is to be formed, is an organic layer, such as a hole injection layer or a hole transport layer, the loss of the hole injection layer or hole transport layer due to the organic solvent can be minimized because it is the organic solvent with the smallest Hansen solubility parameter which the hole injection layer or the hole transport layer may contact.

In the mixed solution of the neutral emissive material and the organic solvent, the concentration of the neutral emissive material may be in the range of 0.3 wt % to 5.0 wt %, and preferably, 0.5 wt % to 2.0 wt %. When the concentration of the neutral emissive material is less than 0.3 wt %, the thickness of a film is so thin that the performance of the device including such a thin film deteriorates. When the concentration of the neutral emissive material is greater than 5.0 wt %, the driving voltage increases.

The method of manufacturing an OLED may further include coating of an organic solvent that is performed after respective coatings except the final coating. The organic solvent used in coating of an organic solvent may be identical to or may be different from the organic solvent that forms the previously coated layer. The coating of an organic solvent, which is optional, may results in less pinholes.

The mixed solution of the neutral emissive material and the organic solvent can be coated using at least one method selected from spin coating, dip coating, spray coating and roll coating. However, the coating method is not limited to these methods.

An embodiment of the method of an OLED including multicoating will be described in detail.

Figure 4:
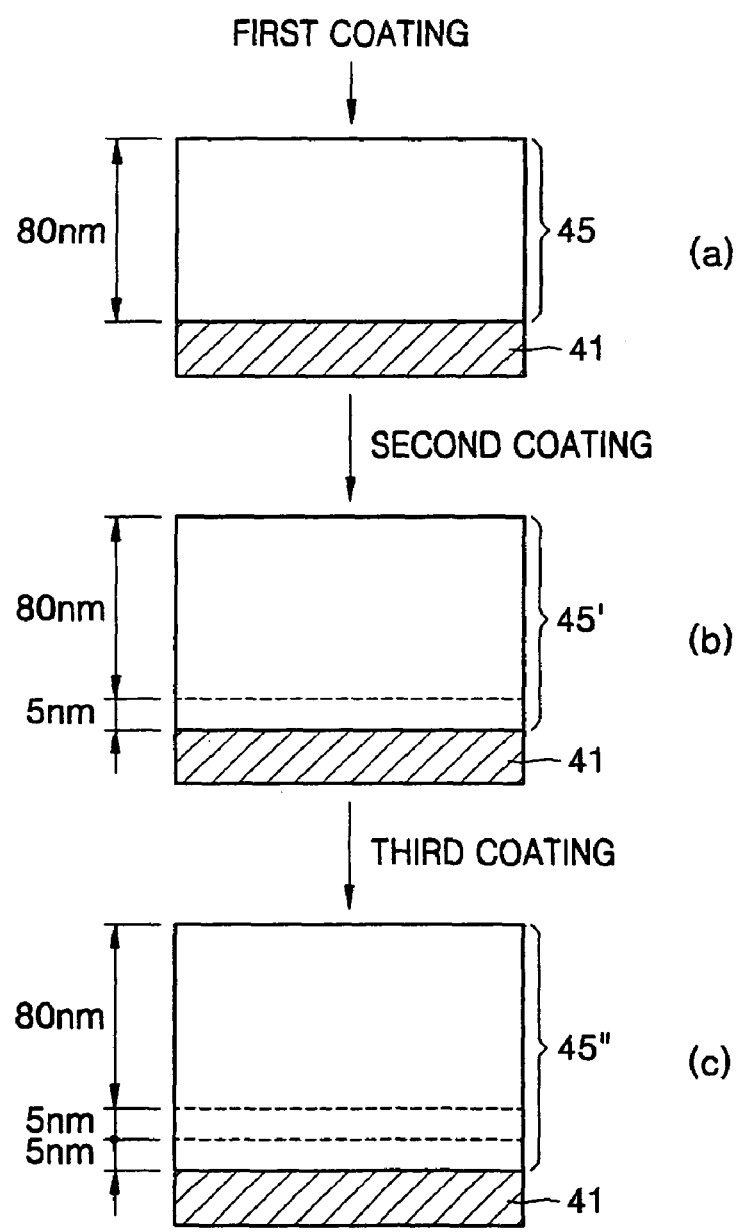
FIGS. 4 through 6 are schematic views illustrating methods of manufacturing an organic light emitting device (OLED) according to embodiments of the present invention.

Referring to FIG. 4, the mixed solution of a neutral emissive material and an organic solvent is triple-coated on a substrate 41.

In (a) of FIG. 4, an emissive layer is formed on the substrate 41, which may vary according to the structure of an OLED. For example, when an OLED includes a first electrode, an emissive layer, and a second electrode, the substrate 41 may be the first electrode. When an OLED includes a first electrode, a hole transport layer, an emissive layer, and a second electrode, the substrate 41 may be the hole transport layer. Those of ordinary skill in the art can easily understand such a variation.

A mixed solution of a neutral emissive material and an organic solvent is coated on the substrate 41 to form a single-coated layer 45. The concentration of the neutral emissive material in the mixed solution of the neutral emissive material and the organic solvent has already been described. The thickness of the single-coated layer can be adjusted in consideration of the thickness of the emissive layer and the number of coating. The single-coated layer may have a thickness of 30 nm to 150 nm, and preferably, 80 nm.

Then, the mixed solution of the neutral emissive material and the organic solvent is coated on the single-coated layer 45 to form a double-coated layer 45'. At this time, the single-coated layer 45 is partly dissolved by the organic solvent that is used to form the double-coated layer 45'. As a result, the double-coated layer 45' has less defects, such as pinholes, than the single-coated layer 45.

The neutral emissive material and/or the organic solvent for the second coating may be identical to or different from the neutral emissive material and/or the organic solvent for the first coating. In particular, the neutral emissive material for the second coating can be chosen in consideration of the energy band gap of the emissive layer or color modulation. For example, the neutral emissive material for the second coating may have a lower energy band gap than the neutral emissive material for the first coating. When the neutral emissive material for the first coating is a blue emissive material, the neutral emissive material for the second coating can be a green emissive material.

As described above, the method of manufacturing an OLED includes multicoating so that the energy band gap of an emissive layer can be controlled without modification of an emissive layer forming material, for example, co-polymerization.

The thickness of the double-coated layer 45' can be determined in consideration of the loss of thickness of the single-coated layer 45. Referring to (b) of FIG. 4, when the mixed solution of the neutral emissive material and the organic solvent for the second coating is coated to a thickness of 80 nm, the single-coated layer that is formed by the first coating is partly dissolved. The residue of the single-coated layer 45 is a portion of the double-coated layer 45' below the dotted line. The thickness of the residue of the single-coated layer 45 may be about 5 nm, and the thickness of the double-coated layer 45' may be 85 nm because a portion where intermixing occurs due to the first and second coating has a thickness of 80 nm. The intermixing can occur in the present embodiment because heat treatment, such as baking, is not performed between coating processes.

Referring to (c) of FIG. 4, a mixed solution of a neutral emissive material and an organic solvent is coated on the double-coated layer 45' to form a triple-coated layer 45". In this case, the double-coated layer 45' is partly dissolved by the organic solvent used for the third coating. As a result, the triple-coated layer 45" has less defects, such as pinholes, than the double-coated layer 45'.

The neutral emissive material and/or the organic solvent for the third coating may be identical to or different from the neutral emissive material and/or the organic solvent for the second coating. In particular, the neutral emissive material for the third coating can be chosen in consideration of the energy band gap of the emissive layer or color modulation. The thickness of the triple-coated layer 45" can be determined in consideration of the loss of thickness of the double-coated layer 45'. Referring to (c) of FIG. 4, when the mixed solution of the neutral emissive material and the organic solvent is coated on the double-coated layer 45' to a thickness of 80 nm, a 10 nm-thick portion of the double-coated layer 45' remains (see a portion under the upper doted line), and thus, the thickness of the triple-coated layer 45" becomes 90 nm.

Then, the triple-coated layer 45" is heat treated to form an emissive layer. The temperature for the heat treatment may vary depending on the neutral emissive material and the organic solvent for the third coating, and can be easily determined by those of ordinary skill in the art.

Another embodiment of the method of manufacturing an OLED including multicoating will be described in detail with reference to FIG. 5. In the present embodiment, a mixed solution of a neutral emissive material and an organic solvent is applied three times to a predetermined substrate 51. The method further includes spinning of an organic solvent each after a first coating and a second coating.

Figure 5:
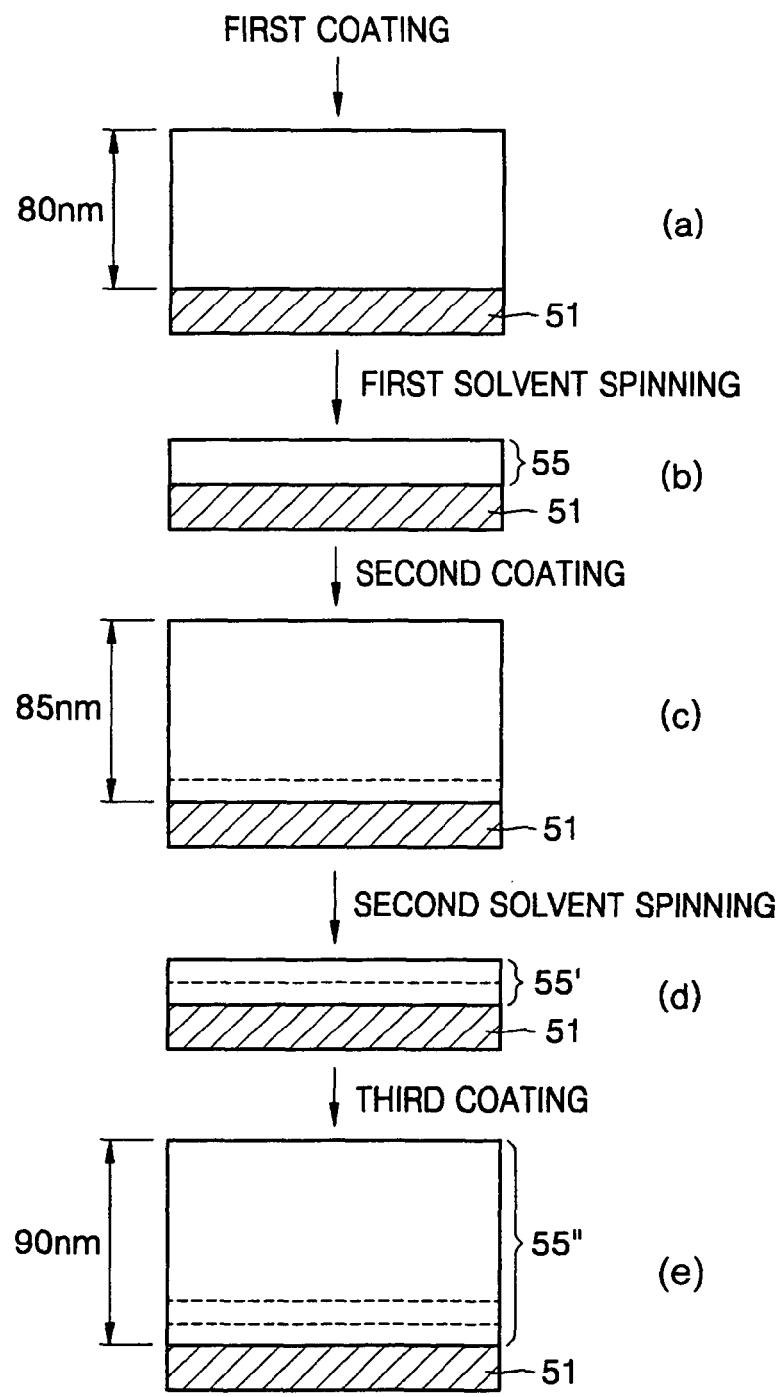

Referring to (a) of FIG. 5, the substrate 51, on which an emissive layer is to be formed, may vary according to the structure of an OLED. The mixed solution of the neutral emissive material and the organic solvent is coated on the substrate 51 and then a first organic solvent spinning is performed, thus forming a single-coated layer 55 as illustrated in (b) of FIG. 5.

An organic solvent used for the first organic solvent spinning may be identical to or different from the organic solvent used for the first coating. In particular, when the organic solvent for the first organic solvent spinning can dissolve the neutral emissive material for the first coating, the single-coated layer 55 may have less pinholes. In addition, impurities at the surface of a layer obtained from the first coating can be removed through the first organic solvent spinning.

Referring to (c) of FIG. 5, a mixed solution of a neutral emissive material and an organic solvent is applied for a second time to the single-coated layer 55 and then a second organic solvent spinning method is performed, thus forming a double-coated layer 55' as illustrated in (d) of FIG. 5. In this case, the single-coated layer 55 may be partly dissolved by the organic solvent used for the second coating. The organic solvent used for the second organic solvent spinning may be identical to or different from the organic solvent used for the second coating. As a result, the double-coated layer 55' has less defects, such as pinholes, than the single-coated layer 55.

Subsequently, a mixed solution of a neutral emissive material and an organic solvent is applied for a third time to the double-coated layer 55' to form a triple-coated layer 55" as illustrated in (e) of FIG. 5. The double-coated layer 55' is partly dissolved by the organic solvent used for the third coating. As a result, the triple-coated layer 55" has less defects, such as pinholes, than the double-coated layer 55'.

The triple-coated layer 55" is heat treated to form an emissive layer. The heat treatment temperature may be determined by the neutral emissive material and the organic solvent that form the triple-coated layer 55", and can be easily chosen by those of ordinary skill in the art. In order to improve the effects of the present invention, the neutral emissive material is heat treated at a glass transition temperature of the neutral emissive material or higher.

A method of manufacturing an OLED according to yet another embodiment of the present invention includes: coating a first mixed solution of a first neutral emissive material and a first organic solvent on an area, on which an emissive layer is to be formed (operation 1); and heat treating the coating layer (operation 2); coating a second mixed solution of a second neutral emissive material and a second organic solvent on the heat-treated layer (operation 3); and repeating the operation 2 and the operation 3 at least one time. The use of the heat treatment between coating processes can reduce intermixing that occurs when a coated upper layer dissolves an underlying layer.

The method according to the present embodiment includes at least two coating processes to form an emissive layer so that the emissive layer has less pinholes, which can be easily formed during a conventional coating process, than a conventional coating method. Accordingly, the emissive layer that is formed according to the present embodiment and an OLED including the emissive layer have a long lifetime. In addition, by using the method of the present embodiment, the neutral emissive material of the emissive layer has an improved orientation and a high density as illustrated in FIG. 3B, and thus the efficiency of the emissive layer can be increased.

Operations 2 and 3 can be performed, for example, one, two, or three times. The cycle of the operations 2 and 3 can be controlled in consideration of the manufacturing costs and time.

Detailed descriptions (excluding the concentration) of the neutral emissive material and the organic solvent have been referred in previous embodiments.

Accordingly, for example, the first neutral emissive material may have a lower or higher energy band gap than the second neutral emissive material. In addition, the first organic solvent may have a smaller Hansen solubility parameter than the second organic solvent. For example, when a substrate, on which an emissive layer is to be formed, is an organic layer, such as a hole transport layer or a hole injection layer, the loss of the hole transport layer and the hole injection layer can be minimized due to the use of the first organic solvent with a smaller Hansen solubility solvent.

In a mixed solution of the neutral emissive material and the organic solvent, the concentration of the neutral emissive material may be in the range of 0.1 wt % to 1.5 wt %, preferably, 0.2 wt % to 0.7 wt %. When the concentration of the neutral emissive material is less than 0.1 wt %, the underlying layer is mostly dissolved so that even when several layers are deposited, sufficient thickness cannot be attained. When the concentration of the neutral emissive material is greater than 1.5 wt %, several layers deposited using heat treatment are too thick.

The heat treatment in operation 2 may contribute to the increase of the thickness of the emissive layer. The heat treatment can be performed at a glass transition temperature of the neutral emissive material or higher (heat treatment A), or lower than the glass transition temperature of the neutral emissive material (heat treatment B.) The decision to use the heat treatment A or the heat treatment B depends on the neutral emissive material and the thickness of the emissive layer. In some cases, a combination of the heat treatments A and B can be used.

According to the heat treatment A, the heat treatment (operation 2 ) may be performed at the glass transition temperature of the neutral emissive material or higher. In this case, after the heat treatment, the chain morphology of the neutral emissive material can be changed such that the interchain interaction is increased. As a result, a refractive index and an effective conjugation length of the neutral emissive material are increased and thus a free volume in the polymer thin film can be decreased. Therefore, a better orientation and high density of the neutral emissive material can be attained.

In detail, the temperature for the heat treatment A is the glass transition temperature of the neutral emissive material, a thermal decomposition temperature of the neutral emissive material, or a temperature between the glass transition temperature and the thermal decomposition temperature. When the heat treatment is performed at a higher temperature than the thermal decomposition temperature of the neutral emissive material, the neutral emissive material decomposes and cannot act as an emissive material.

The heat treatment A may be performed for 10 min. to 2 hours, and preferably, 30 min. to 1 hour. When the heat treatment A is performed for less than 10 min., the heat treatment is not sufficient to intermix more of the coating layer with the underlying layer. When the heat treatment A is performed for more than 2 hours, the surface of the film may be oxidized.

According to the heat treatment B, the heat treatment (operation 2) may be performed at a temperature lower than the glass transition temperature of the neutral emissive material. In this case, the thickness of the emissive layer can be increased without changing the chain morphology.

In detail, the heat treatment B can be performed at room temperature (20° C.) or a temperature between room temperature (20° C.) and the glass transition temperature of the neutral emissive material. When the heat treatment is performed at a temperature lower than 20° C., it is difficult to vaporize the solvent.

The heat treatment B may be performed for 10 min. to 24 hours, and preferably, 30 min. to 2 hour. When the heat treatment B is performed for less than 30 min., the solvent is not vaporized. On the other hand, when the heat treatment B is performed for more than 24 hours, the manufacturing time is too long, and thus, the manufacturing method is inefficient for commercial applications.

The mixed solution of the neutral emissive material and the organic solvent may be coated using conventional methods, for example, at least one method selected from spin coating, dip coating, spray coating, and roll coating. However, the coating method is not limited thereto.

Various embodiments of the present embodiment will now be described.

An embodiment of the present embodiment invention will be described with reference to FIG. 6. In the present embodiment, a mixed solution of a neutral emissive material and an organic solvent is triple coated on a predetermined substrate 61, and double heat treatments are performed between coating processes.

Figure 6:
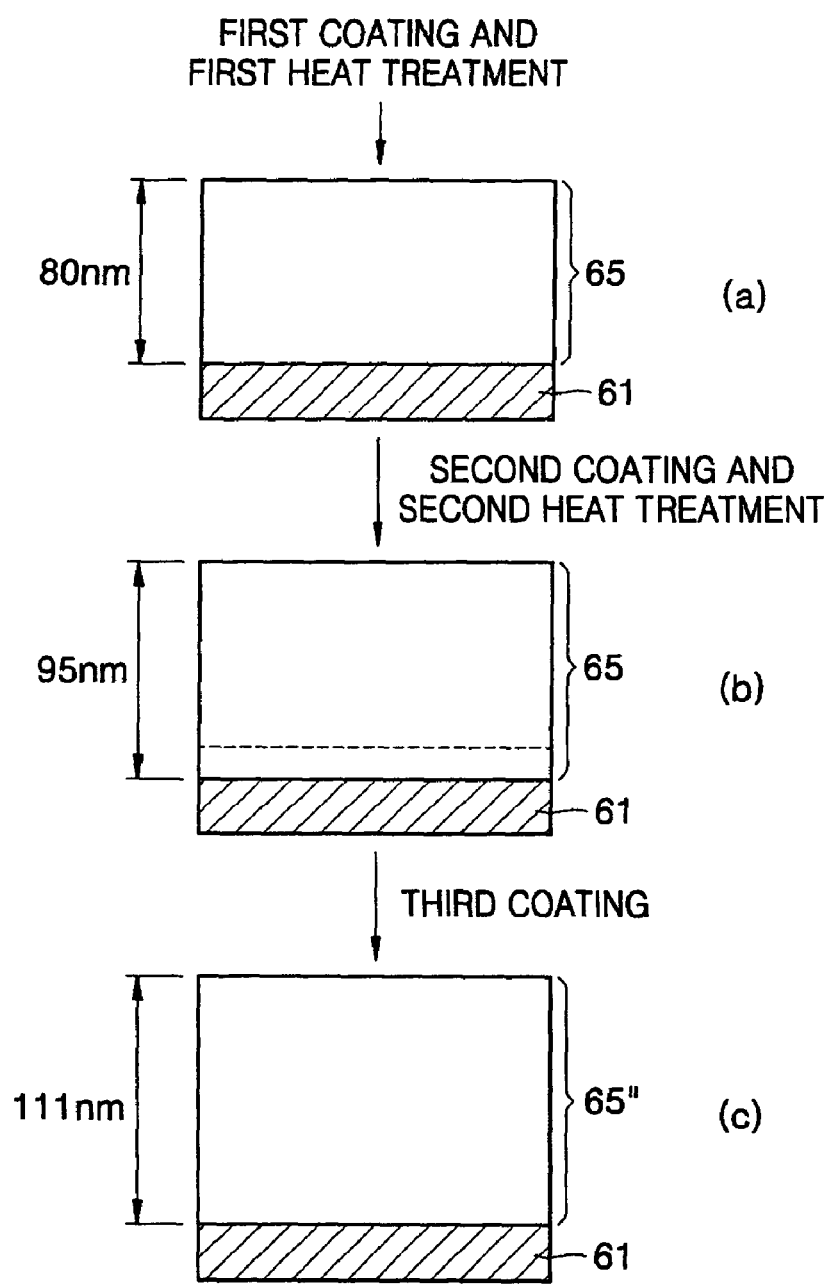

In (a) of FIG. 6, the substrate 61, on which an emissive layer is to be formed, may vary according to the structure of an OLED. For example, when an OLED includes a first electrode, an emissive layer, and a second electrode, the substrate 61 may act as the first electrode. When an OLED includes a first electrode, a hole injection layer, an emissive layer, and a second electrode, the substrate 61 may act as the hole injection layer. Those of ordinary skill in the art can easily understand such a variation.

Referring to FIG. 6, the mixed solution of the neutral emissive material and the organic solvent is applied for a first time to the substrate 61 to form a single-coated layer. Then, the single-coated layer is heat treated for a first time at a temperature between the glass transition temperature and the thermal decomposition temperature of the neutral emissive material that forms the single-coated layer, or a temperature between room temperature and the glass transition temperature of the neutral emissive material that forms the single-coated layer, thus forming a first heat treated layer 65.

The concentration of the neutral emissive material in the mixed solution of the neutral emissive material and the organic solvent of the single-coated layer has already been described. The thickness of the first heat treated layer 65 may be adjusted depending on the thickness of the emissive layer and the number of coatings. For example, the thickness of the first heat treated layer 65 may be in the range of 30 nm to 150 nm, and preferably, 80 nm as illustrated in (a) of FIG. 6.

Subsequently, a mixed solution of a neutral emissive material and an organic solvent is second coated on the first heat treated layer 65 to form a double-coated layer. The double-coated layer is heat treated for a second time at a temperature between the glass transition temperature and the thermal decomposition temperature of the neutral emissive material that forms the double-coated layer, or a temperature between room temperature and the glass transition temperature of the neutral emissive material that forms the double-coated layer, thus forming a second heat treated layer 65'. When the mixed solution is coated for a second time to a thickness of 80 nm, a 95 nm-thick second heat treated layer 65' can be obtained because the first heat treated layer 65 is less dissolved due to the first heat treatment when the second coating is performed.

Although the first heat treated layer 65 is partly dissolved by the organic solvent that is used for the second coating, the amount of loss is smaller than when heat treatment is not used. That is, the first heat treated layer 65 is less dissolved by the organic solvent that is used for the second coating than in previous embodiments. Through the above processes, the neutral emissive material of the second heat treated layer 65' has an improved orientation and a high density, and less pinholes than the first heat treated layer 65.

The neutral emissive material and/or the organic solvent for the second coating may be identical to or different from the neutral emissive material and/or the organic solvent for the first coating. In particular, the neutral emissive material for the second coating can be chosen in consideration of the energy band gap of the emissive layer or color modulation. For example, the neutral emissive material for the second coating may have a lower energy band gap than the neutral emissive material for the first coating. When the neutral emissive material for the first coating is a blue emissive material, the neutral emissive material for the second coating can be a green emissive material.

As described above, the method of manufacturing an OLED includes multi-coating such that the energy band gap of the emissive layer can be controlled without chemically modifying an emissive layer forming material, such as copolymerization.

Then, a mixed solution of a neutral emissive material and an organic solvent is coated for a third time on the second heat treated layer 65' to form a triple-coated layer 65" as illustrated in (c) of FIG. 6. In this case, the second heat treated layer 65' is partly dissolved by the organic solvent that is used for the third coating. As a result, the triple-coated layer 65" has less pinholes than the second heat treated layer 65', and the neutral emissive material of the triple-coated layer 65" has an improved orientation and high density.

The thickness of the triple-coated layer can be determined in consideration of the dissolution of the double-coated layer 65'. Referring to (c) of FIG. 6, when the mixed solution is third coated to a thickness of 80 nm, the triple-coated layer 65" may have a thickness of 111 nm.

The neutral emissive material and/or the organic solvent used for the third coating may be identical to or different from the neutral emissive material and/or the organic solvent used for the second coating. In particular, the neutral emissive material used for the third coating can be chosen in consideration of the energy band gap of the emissive layer or color modulation. The thickness of the triple-coated layer 65" can be determined in consideration of the dissolution of the double-coated layer. The orientation and density of the neutral emissive material of the triple-coated layer 65" has been described before in reference to FIG. 3B.

The triple-coated layer 65" is heat-treated to form an emissive layer according to the present embodiment of the present invention. The temperature for the heat treatment is controlled depending on the neutral emissive material and the organic solvent of the triple-coated layer 65", and can be easily determined by those of ordinary skill in the art.

The method according to the present embodiment may further include the spinning of an organic solvent, used in the previous embodiment.

An OLED manufactured using the method of manufacturing an OLED according to still another embodiment of the present invention is provided. First, a substrate is prepared. As described above, the substrate, on which an emissive layer is to be formed, may act as a first electrode, a hole injection layer or hole transport layer formed on the first electrode, according to the structure of an OLED. Then, the emissive layer is formed using a neutral emissive material and methods according to previous embodiments. The neutral emissive material of the emissive layer has an excellent orientation and a high density. Subsequently, a hole blocking layer, an electron transport layer and/or an electron injection layer are optionally formed, and then a second electrode is formed thereon, thus completing an OLED. Other layers apart from the emissive layer can be manufactured using conventional methods.

The present invention will be described in further detail with reference to the following examples. These examples are for illustrative purposes only and are not intended to limit the scope of the present invention.

EXAMPLES

Example 1

Manufacture of Polymer Film Using a Multicoating Method (Sample for Ellipsometry)

A silicon wafer composed of about 2.0 nm-thick native oxide only was cut to a size of 30 mm×30 mm, washed in pure water using an ultrasonic wave for 5 minutes, washed in isopropyl alcohol using an ultrasonic wave for 5 minutes, and then dried in an oven.

Separately, 0.4 wt % of a spirofluorene-based polymer having a molecular weight of 1.5 million that is a polyfluorene-based blue emissive material was dissolved in xylene. Some of the mixture was applied to the silicon wafer using a micro pipette and spin coated thereon to a thickness of 80 nm to form a single-coated layer. The single-coated layer was heat treated at 220° C. for 30 minutes to form a first heat treated layer. Then, some of the mixture was applied to the first heat treated layer using a micro pipette and spin coated on the first heat-treated layer to form a double-coated layer. The double-coated layer was heat treated at 220° C. for 20 minutes. The spin coating and heat treatment processes similar to that used for the double-coated layer were performed three times more to form a fivefold-coated layer. As a result, an emissive layer with a thickness of 98 nm was formed. The resulting emissive layer will be referred to as Sample 1.

Comparative Example A

A silicon wafer composed of about 2.0 nm-thick native oxide only was cut to a size of 30 mm×30 mm, washed in pure water using an ultrasonic wave for 5 minutes, washed in isopropyl alcohol using an ultrasonic wave for 5 minutes, and then dried in an oven.

Separately, a 1.1 wt % spiropolyfluorene-based polymer having a molecular weight of 1.5 million that is a polyfluorene based blue emissive material and xylene (based on the total weight of spiropolyfluorene-based blue emissive material and xylene) was spin coated once on the silicon wafer and then heat treated at 50° C. for 1 hour to form a 111 nm-thick emissive layer. The resulting emissive layer will be referred to as Sample A.

Comparative Example B

A silicon wafer composed of about 2.0 nm-thick native oxide only was cut to a size of 30 mm×30 mm, washed in pure water using an ultrasonic wave for 5 minutes, washed in isopropyl alcohol using an ultrasonic wave for 5 minutes, and then dried in an oven.

Separately, a mixture of a 1.1 wt % spiropolyfluorene-based polymer having a molecular weight of 1.5 million that is polyfluroene-based blue emissive material and xylene (based on the total weight of spiropolyfluorene-based blue emissive material and xylene) was spin coated once on the silicon wafer and then heat treated at 220° C. for 1 hour to form a 111 nm-thick emissive layer. The resulting emissive layer will be referred to as Sample B.

Measurement Example 1

Figure 7:
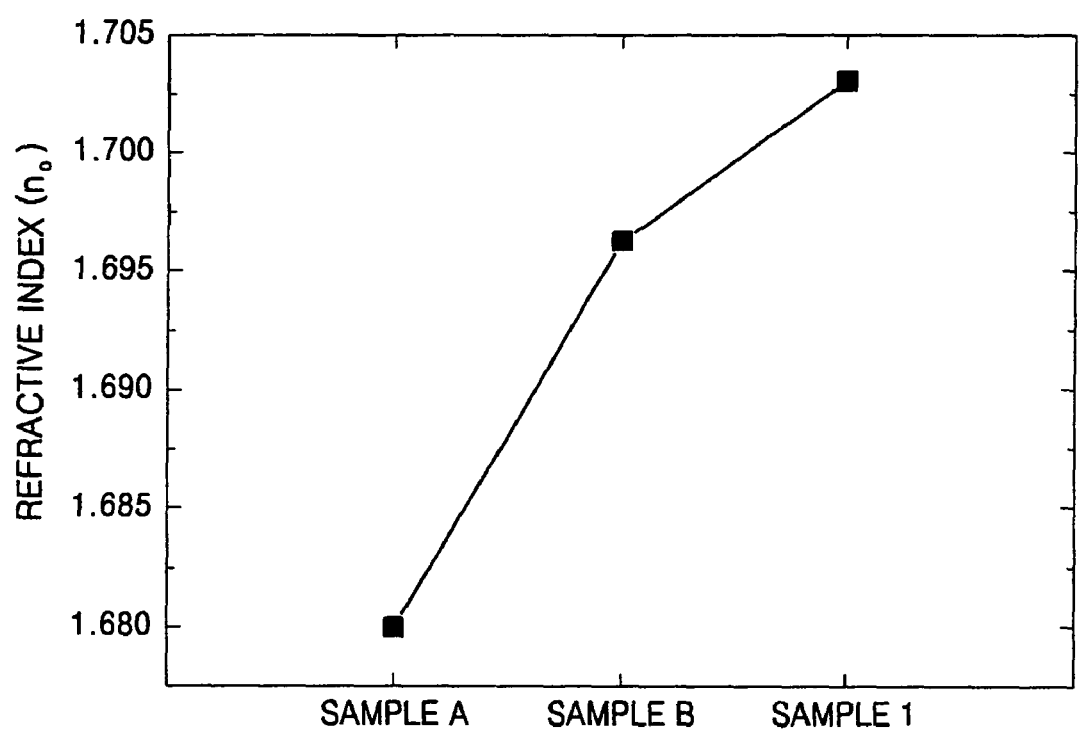
FIG. 7 is a graph of refractive indices ($n_o$) of conventional emissive layers and an emissive layer according to an embodiment of the present invention.
Figure 8:
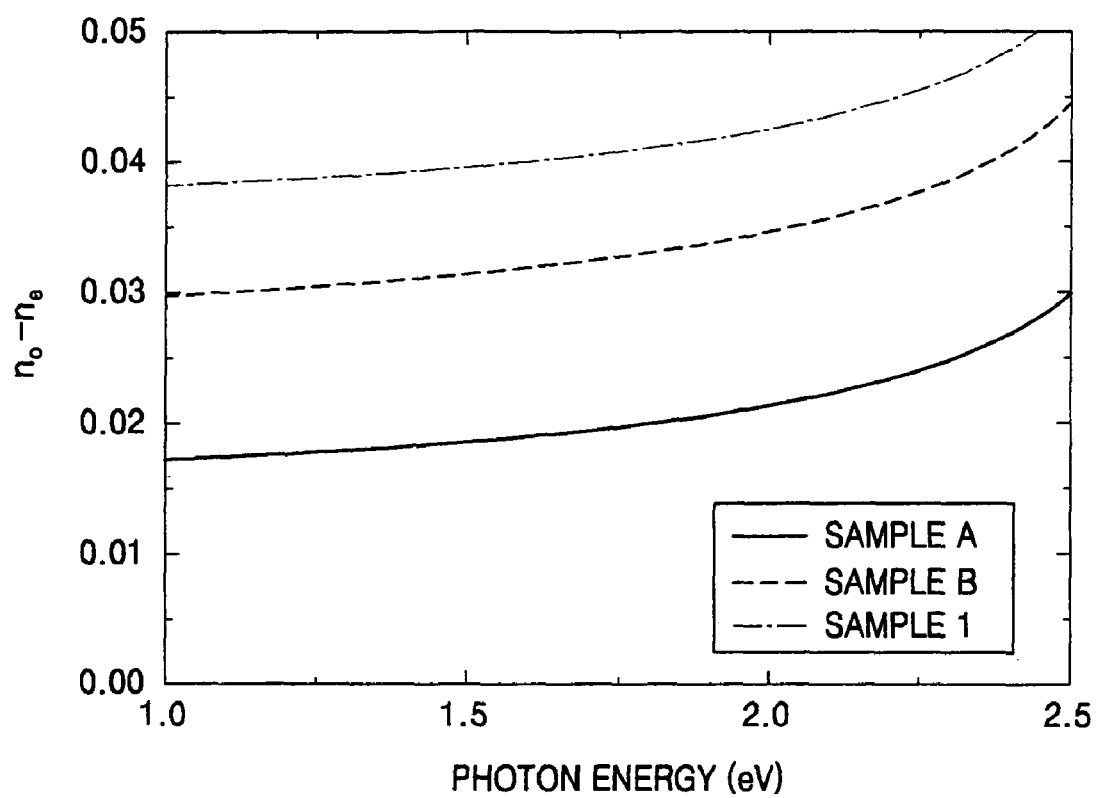
FIG. 8 is a graph of $n_o-n_e$ parameters of conventional emissive layers and an emissive layer according to an embodiment of the present invention.

$n_o$ and $n_o-n_e$ of Samples 1, A and B $n_o$ and $n_o-n_e$ parameters of Samples 1, A and B were shown in FIGS. 7 and 8, respectively. $n_o$ and $n_o-n_e$ parameters of Samples 1, A and B was measured using ellipsometer (Variable Angle Spectroscopic Eilipsomer (VASE) VD-250, obtained from J. A. Woollam Co.). The results were analyzed using WVASE 32 Version 3.45 (obtained from J. A. Woollam. Co. Inc). In general, an ellipsometer used for ellipsometry includes a lamp that is a white light source, a polarizing device that polarizes light, a monochrometer that separates a short-wavelength light form the white light source, and a detector that decodes a signal.

FIG. 7 illustrates $n_o$ obtained through spectroscopic ellipsometry at 2.58 eV. Referring to FIG. 7, $n_o$ of Sample A is about 1.680, $n_o$ of Sample B is about 1.698, and $n_o$ of Sample 1 is about 1.7025. That is, $n_o$ of Sample 1 was greater than $n_o$ of Samples A and B by about 0.005. As a result, it was confirmed that Sample 1 according to Example 1 had higher density than Samples A and B according to Comparative Examples.

FIG. 8 is a graph of $n_o-n_e$ parameters with respect to photon energy of Samples 1, A and B. Referring to FIG. 8, the photon energy was in the range of 1.0 eV to 2.5 eV. $n_o-n_e$ of Sample 1 was about 0.02 greater than that of Sample A and about 0.01 greater than that of Sample B in this range. From this result, it was confirmed that Sample 1 had greater $n_o-n_e$ than Samples A and B.

Measurement 2

Photoluminance (PL) Intensity

Figure 9:
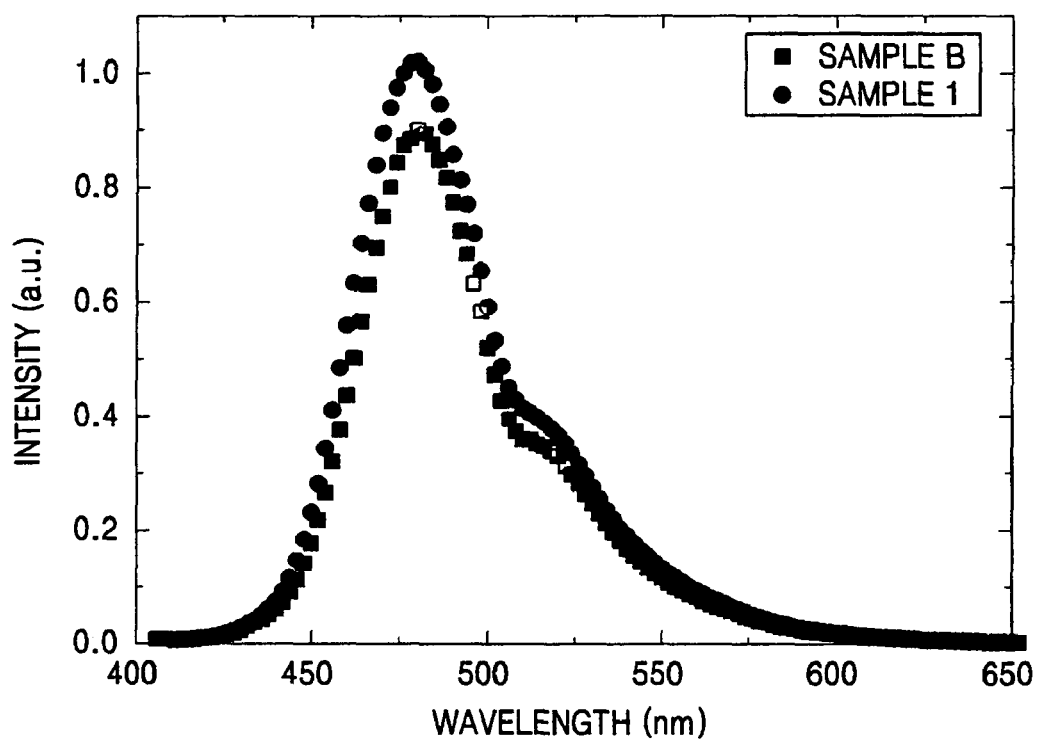
FIG. 9 is a graph of photoluminance (PL) intensity of a conventional OLED and OLED according to an embodiment of the present invention.

FIG. 9 illustrates PL intensities of Samples 1 and B. Referring to FIG. 9, Sample 1 had about 10% greater PL intensity than Sample B although Sample 1 was about 10% thinner than Sample B.

Example 2

15 $\Omega/cm^2$ (1200 Å) ITO glass substrate (obtained from Corning Co.) was cut to a size of 50 mm×50 mm×0.7 mm, washed in pure water using an ultrasonic wave for 5 minutes, washed in isopropyl alcohol using an ultrasonic wave for 5 minutes, and washed using ultra violet (UV) light and ozone for 30 minutes. PEDOT/PSS (Baytron P AI4083, obtained from Bayer Co.) was coated to a thickness of 50 nm on the substrate at 2,000 rpm and then heat-treated at 200° C. for 10 min to form a hole injection layer.

PFB (a hole transporting material obtained from Dow Chemical Co.) was spin coated on the hole injection layer to form a 10 nm-thick hole transport layer, and then heat-treated at 220° C. for 1 hour.

Some of a mixture of 1.4 wt % of a spirofluorene-based blue emissive material having a molecular weight of 0.3 million dissolved in xylene was applied to the hole transport layer using a micro pipette, and spin coated thereon to a thickness of 85 nm to form a single-coated layer. Some of the mixture was spin coated on the single-coated layer to form a double-coated layer. The double-coated layer was heat treated at 220° C. for 30 minutes to form an 80 nm-thick emissive layer. Then, a 2.7 nm-thick Ca layer and a 250 nm-thick Al layer were sequentially formed on the blue emissive layer to form a second electrode, thus completing an OLED. The resulting OLED will be referred to as Sample 2.

Comparative Example C

An OLED was manufactured in the same manner as in Example 2, except that a mixture of a 1.1 wt % polyfluorene-based blue emissive material and xylene (based on the total weight of polyfluorene-based blue emissive material and xylene) was spin coated once and then heat treated at 220° C. for 1 hour to form a 80 nm-thick emissive layer. The resulting OLED will be referred to as Sample C.

Measurement Example 3

Lifetime and Efficiency of Samples 2 and C

Figure 10:
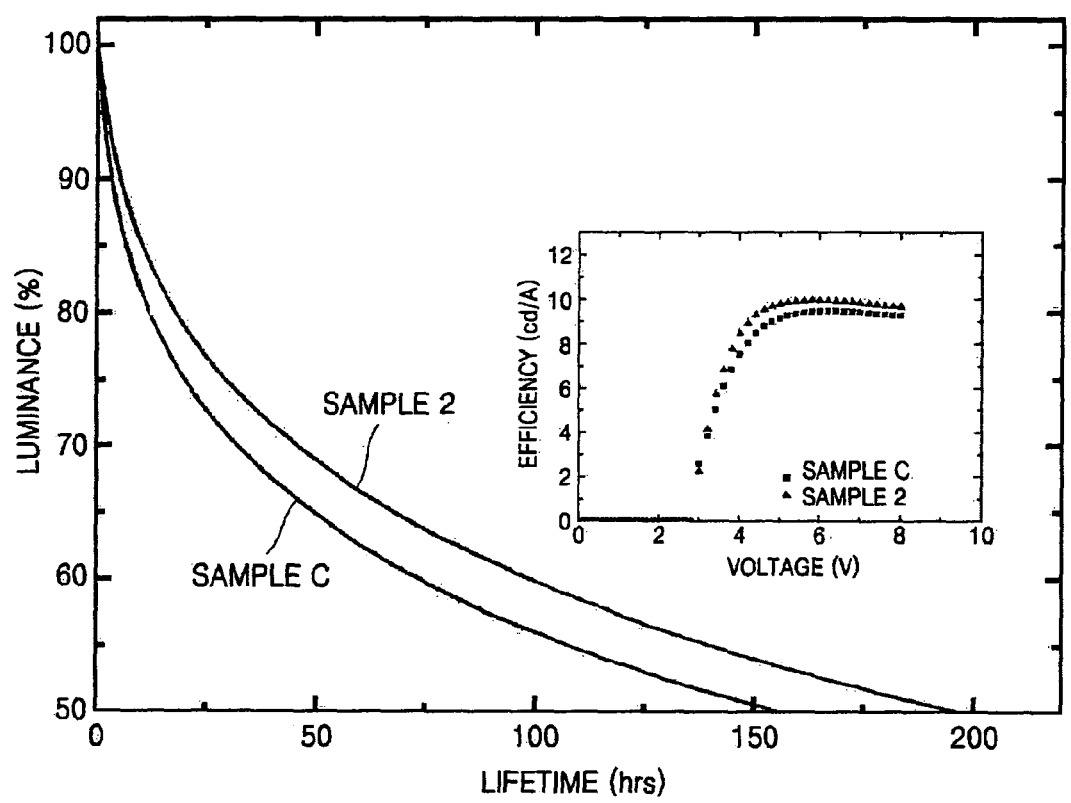
FIG. 10 is a graph of luminance and efficiency of a conventional OLED and an OLED according to an embodiment of the present invention.

FIG. 10 is a graph of lifetime and efficiency of Samples 2 and C. Lifetime and efficiency were measured using a photodiode. The lifetime was measured by measuring luminance based on time and is represented by a time when an initial luminance is decreased by 50%.

Referring to FIG. 10, Sample 2 required about 200 hours to lose 50% of its initial luminance (800 cd/m$^2$), and Sample C required only about 155 hours to lose 50% of its initial luminance (800 cd/m$^2$). That is, Sample 2 according to Example 2 had about 25% longer lifetime than Sample C according to Comparative Example C.

Measurement Example 4

A 15 $\Omega/cm^2$ (1200 Å) ITO glass substrate (obtained from Corning Co.) was cut to a size of 50 mm×50 mm×0.7 mm, washed in pure water using an ultrasonic wave for 5 minutes, washed in isopropyl alcohol using an ultrasonic wave for 5 minutes, and washed using ultra violet (UV) light and ozone for 30 minutes. PEDOT/PSS (Baytron P AI4083, obtained from Bayer Co.) was coated to a thickness of 50 nm on the substrate at 2,000 rpm and then heat-treated at 200° C. for 10 min to form a hole injection layer.

PFB (a hole transporting material obtained from Dow Chemical Co.) was spin coated on the hole injection layer and heat treated at 220° C. for 1 hour in a nitrogen atmosphere to form a 10 nm-thick hole transport layer.

Some of a mixture of 0.4 wt % of a spirofluorene-based blue emissive material having a molecular weight of 1.5 million dissolved in xylene was applied to the hole transport layer using a micro pipette, and spin coated thereon to a thickness of 28 nm to form a single-coated layer. The single-coated layer was heat treated at 220° C. for 30 minutes, and the surface of the heat treated single-layer was observed using atomic force microscopy (AFM). Some of the mixture was applied to the heat-treated single coated layer using a micro pipette to form a double-coated layer. The double-coated layer was heat treated at 220° C. for 30 minutes, and the surface of the heat treated double-coated layer was observed using AFM. Some of the mixture was applied to the heat treated double-coated layer using a micro pipette to form a triple-coated layer. The triple-coated layer was heat treated at 220° C. for 30 minutes, thus completing a 70 nm-thick emissive layer. The surface of the emissive layer was measured using AFM.

Figure 11A:
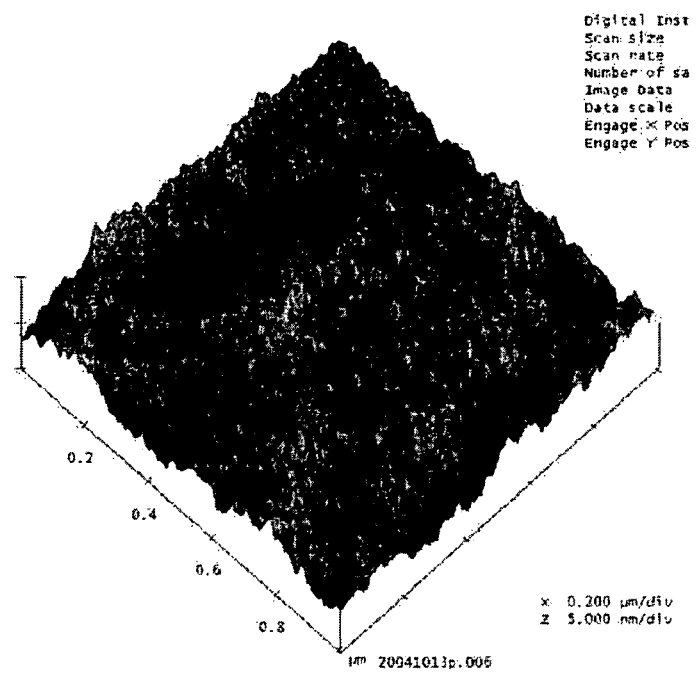
FIG. 11A is an atomic force microscope (AFM) image of a single-coated layer formed by a single coating process when an emissive layer of an OLED according to an embodiment of the present invention is formed.
Figure 11B:
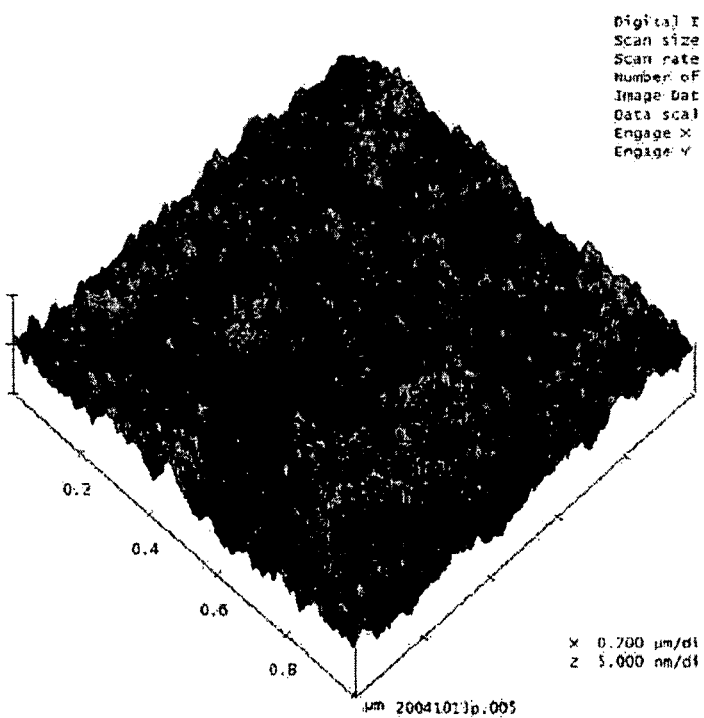
FIG. 11B is an AFM image of a double-coated layer that was formed by first heat treating the single-coated layer and then coating the heat treated single-coated layer a second time according to an embodiment of the present invention.
Figure 11C:
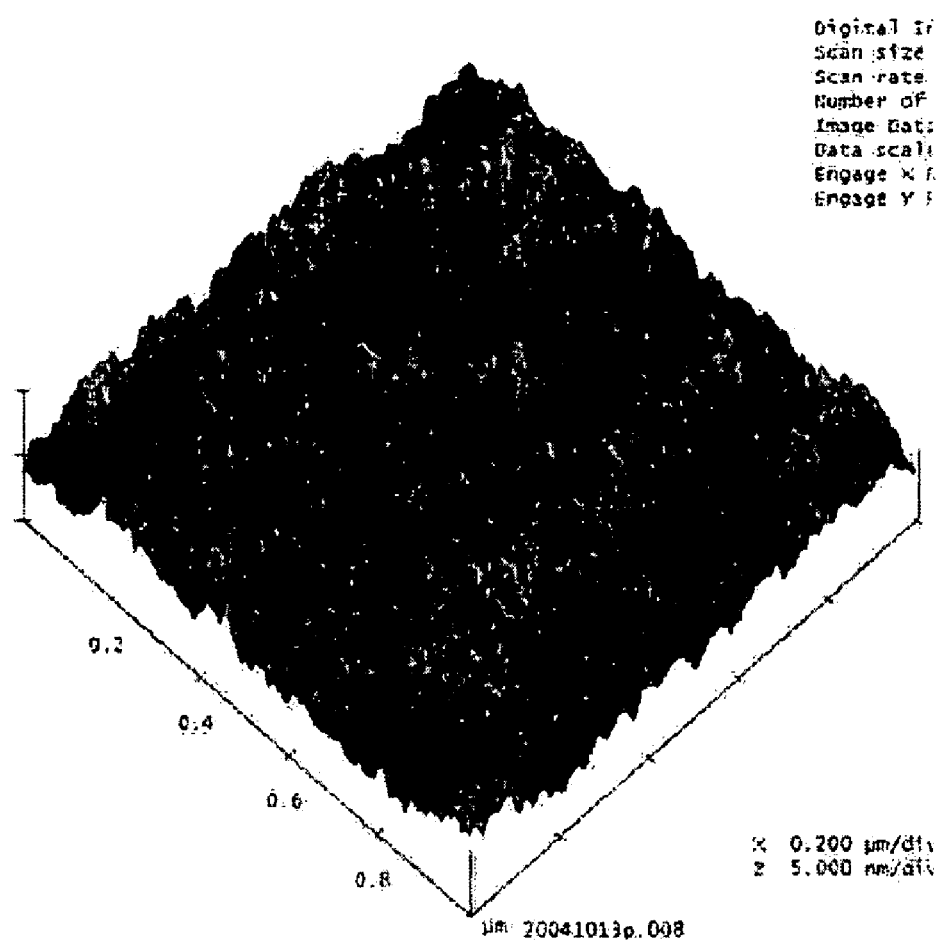
FIG. 11C is an AFM image of a triple-coated layer that was formed by second heat treating the double-coated layer and then coating the heat treated double-coated layer a third time according to an embodiment of the present invention.

FIGS. 11A through 11C are AFM images of each layer. Referring to FIG. 11A, the roughness of the heat treated single-coated layer was rms 0.751 nm. Referring to FIG. 11B, the roughness of the heat treated double-coated layer was 0.708 nm. Referring to FIG. 11C, the roughness of the heat treated triple-coated layer of the emissive layer was rms 0.755 nm. From the results, it was confirmed that the repetition of the coating process is not related to the roughness of the surfaces of the single-coated layer, the double-coated layer, and the triple-coated layer.

Figure 12:
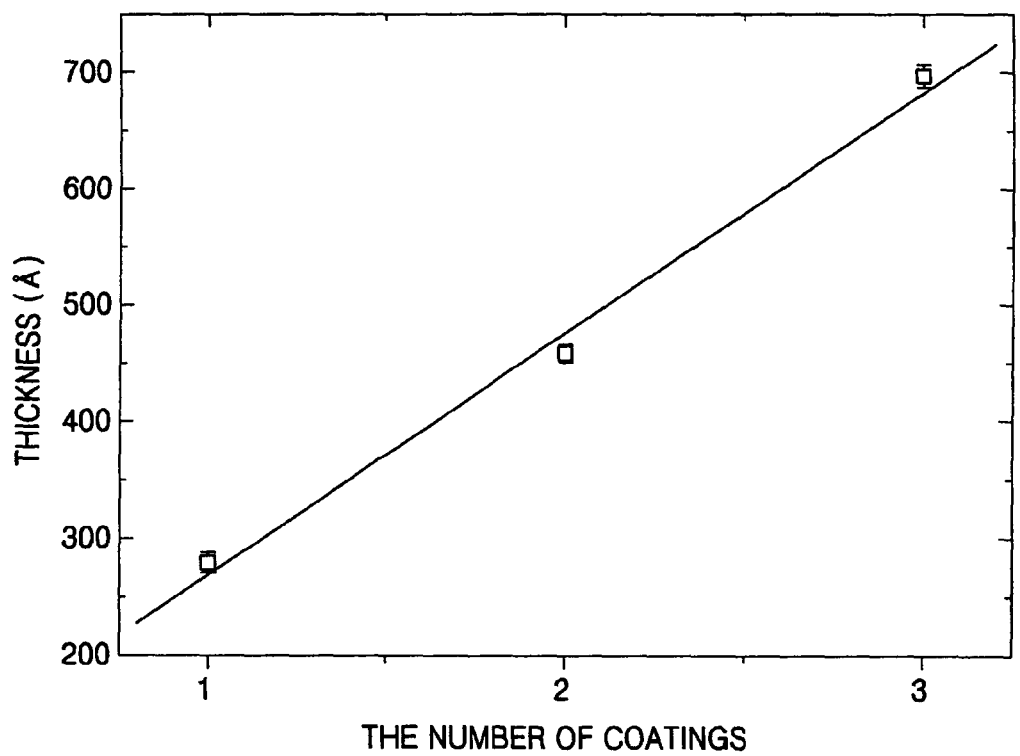
FIG. 12 is a graph of thicknesses of the single coated layer, the double-coated layer, and the triple-coated layer illustrated in FIGS. 11A through 11C.

FIG. 12 is a graph of the thicknesses of the single, double, and triple-coated layers. Referring to FIG. 12, when the number of coating increased, the thickness of a layer increased because the heat-treatment performed after each coating reduces the dissolution of the previously coated layer by the organic solvent used for the next coating.

Example 3

A 15 Ω/cm² (1200 Å) ITO glass substrate (obtained from Corning Co.) was cut to a size of 50 mm×50 mm×0.7 mm, washed in pure water using an ultrasonic wave for 5 minutes, washed in isopropyl alcohol using an ultrasonic wave for 5 minutes, and washed using ultra violet (UV) light and ozone for 30 minutes. PEDOT/PSS (Baytron P AI4083, obtained from Bayer Co.) was coated to a thickness of 50 nm on the substrate at 2,000 rpm and then heat-treated at 200° C. for 10 min to form a hole injection layer.

PFB (a hole transporting material obtained from Dow Chemical Co.) was spin coated on the hole injection layer and heat treated at 220° C. for 1 hour in a nitrogen atmosphere to form a 10 nm-thick hole transport layer.

Some of a mixture of 0.4 wt % of a spirofluorene-based blue emissive material having a molecular weight of 1.5 million dissolved in xylene was applied to the hole transport layer using a micro pipette, and spin coated thereon to form a single-coated layer. The single-coated layer was heat treated at 220° C. for 30 minutes such that the thickness of the single-coated layer was about 28 nm. Some of the mixture was spin coated thereon to form a double-coated layer. The double-coated layer was heat treated at 220° C. for 30 minutes such that the thickness of the double-coated layer was about 45 nm. Some of the mixture was spin coated thereon to form a triple-coated layer. The triple-coated layer was heat treated at 220° C. for 30 minutes such that the thickness of the triple-coated layer was about 70 nm to form a 70 nm-thick emissive layer. Then, a 3.1 nm-thick $BaF_2$ layer, a 2.2 nm-thick Ca layer and an 250 nm-thick Al layer were sequentially formed on the blue emissive layer to form a second electrode, thus completing an OLED. The resulting OLED will be referred to as Sample 3.

Examples 4 through 8

OLEDs were manufactured in the same manner as in Example 3, except that the hole transport layer and the second electrode were formed to thicknesses shown in Table 2 using materials shown in Table 2. These OLEDs will be referred to as Samples 4 through 8, respectively.

Comparative Example D

An OLED was manufactured in the same manner as in Example 3, except that a mixture of a 1.1 wt % spiropolyfluorene-based blue emissive material and xylene (based on the total weight of spiropolyfluorene-based blue emissive material and xylene) were spin coated once and then heat treated at 220° C. for 1 hour to form a 70 nm-thick emissive layer. The resulting OLED will be referred to as Sample D.

Comparative Example E through I

OLEDs were manufactured in the same manner as in Comparative Example D, except that the hole transport layer and the second electrode were composed of the materials shown in Table 2 and had various thicknesses shown in Table 2. These OLEDs will be referred to as Samples E through I.

TABLE 2

| Example No./ Comparative Example No. | Sample No. | Hole Transporting Material | Second Electrode Forming Materials and Thickness thereof |
|---|---|---|---|
| 3/D | 3/D | PFB* | $BaF_2$(3.1 nm)/Ca(2.2 nm) |
| 4/E | 4/E | PFB* | $BaF_2$(4.0 nm)/Ca(2.7 nm) |
| 5/F | 5/F | PFB* | $BaF_2$(8 nm)/Ca(5 nm) |
| 6/G | 6/G | BFE* | $BaF_2$(3.1 nm)/Ca(2.2 nm) |
| 7/H | 7/H | BFE* | $BaF_2$(4.0 nm)/Ca(2.7 nm) |
| 8/I | 8/I | BFE* | $BaF_2$(8 nm)/Ca(5 nm) |

*PFB, BFE: hole transporting materials obtained from DOW Chemical Co. (Michael Redecker et al. Adv. Mater. vol 11, p 241, 1999)

Measurement Example 5

Lifetimes of Samples 3 through 8 and Samples D through I

Luminance and Lifetimes of Samples 3 through 8 and D through I were measured using a photodiode and the results are shown in Table 3.

TABLE 3

| Sample No. | Time for Losing Initial Luminance to a Half (Initial Luminance: 100 cd/m²0%) | Time for Losing Initial Luminance to a Half (Initial Luminance: 800 cd/m²0%) |
|---|---|---|
| Sample 3 | 32000 hours | 500 hours |
| Sample 4 | 25600 hours | 400 hours |
| Sample 5 | 22400 hours | 350 hours |
| Sample 6 | 30720 hours | 480 hours |
| Sample 7 | 25600 hours | 400 hours |
| Sample 8 | 32000 hours | 500 hours |
| Sample D | 17920 hours | 280 hours |
| Sample E | 19200 hours | 280 hours |
| Sample F | 17280 hours | 270 hours |
| Sample G | 9600 hours | 150 hours |
| Sample H | 15360 hours | 240 hours |
| Sample I | 19200 hours | 300 hours |

Referring to Table 3, OLEDs according to Examples 3 through 8 had lifetimes of 1.7 through 3.4 times longer than OLEDs according to Comparative Examples D through I.

Example 9

A 15 Ω/cm² (1200 Å) ITO glass substrate (obtained from Corning Co.) was cut to a size of 50 mm×50 mm×0.7 mm, washed in pure water using an ultrasonic wave for 5 minutes, washed in isopropyl alcohol using an ultrasonic wave for 5 minutes, and washed using ultra violet (UV) light and ozone for 30 minutes. PEDOT/PSS (Baytron P AI14083, obtained from Bayer Co.) was coated to a thickness of 50 nm on the washed substrate at 2,000 rpm and then heat-treated at 200° C. for 10 min to form a hole injection layer.

PFB (a hole transporting material obtained from Dow Chemical Co.) was spin coated on the hole injection layer and heat treated at 220° C. for 1 hour in a nitrogen atmosphere to form a 10 nm-thick hole transport layer.

A solution of 1.4 wt % of a spirofluorene-based blue emissive material dissolved in xylene was applied to the hole transport layer using a micro pipette, and spin coated thereon to form a single-coated layer with 80 nm. Then, 1.4 wt % of a polyfluorene-based green emissive material (Dow Green K2, obtained from Dow Corning Co.) dissolved in xylene was coated on the single-coated layer to form a double-coated layer. The result was heat treated at 180° C. for one hour to completely form an emissive layer. Ca and Al were deposited on the blue emissive layer to a thickness of 5 nm and 250 nm, respectively, to form a second electrode, thus completely forming an OLED. The OLED will be referred to as Sample 9.

Example 10

An OLED was manufactured in the same manner as in Example 9, except that the second electrode was formed by depositing $BaF_2$, Ca, and Al to a thickness of 1 nm, 5 nm, and 250 nm, sequentially. The OLED will be referred to as Sample 10.

Example 11

An OLED was manufactured in the same manner as in Example 9, except that the second electrode was formed by sequentially depositing $BaF_2$, Ca, and Al to a thickness of 6 nm, 5 nm, and 250 nm, respectively. The OLED will be referred to as Sample 11.

Example 12

An OLED was manufactured in the same manner as in Example 9, except that the second electrode was formed by sequentially depositing $BaF_2$, Ca, and Al to a thickness of 10 nm, 5 nm, and 250 nm, respectively. The OLED will be referred to as Sample 12.

Measurement Example 6

Color Tuning of Samples 9 through 12

Figure 13:
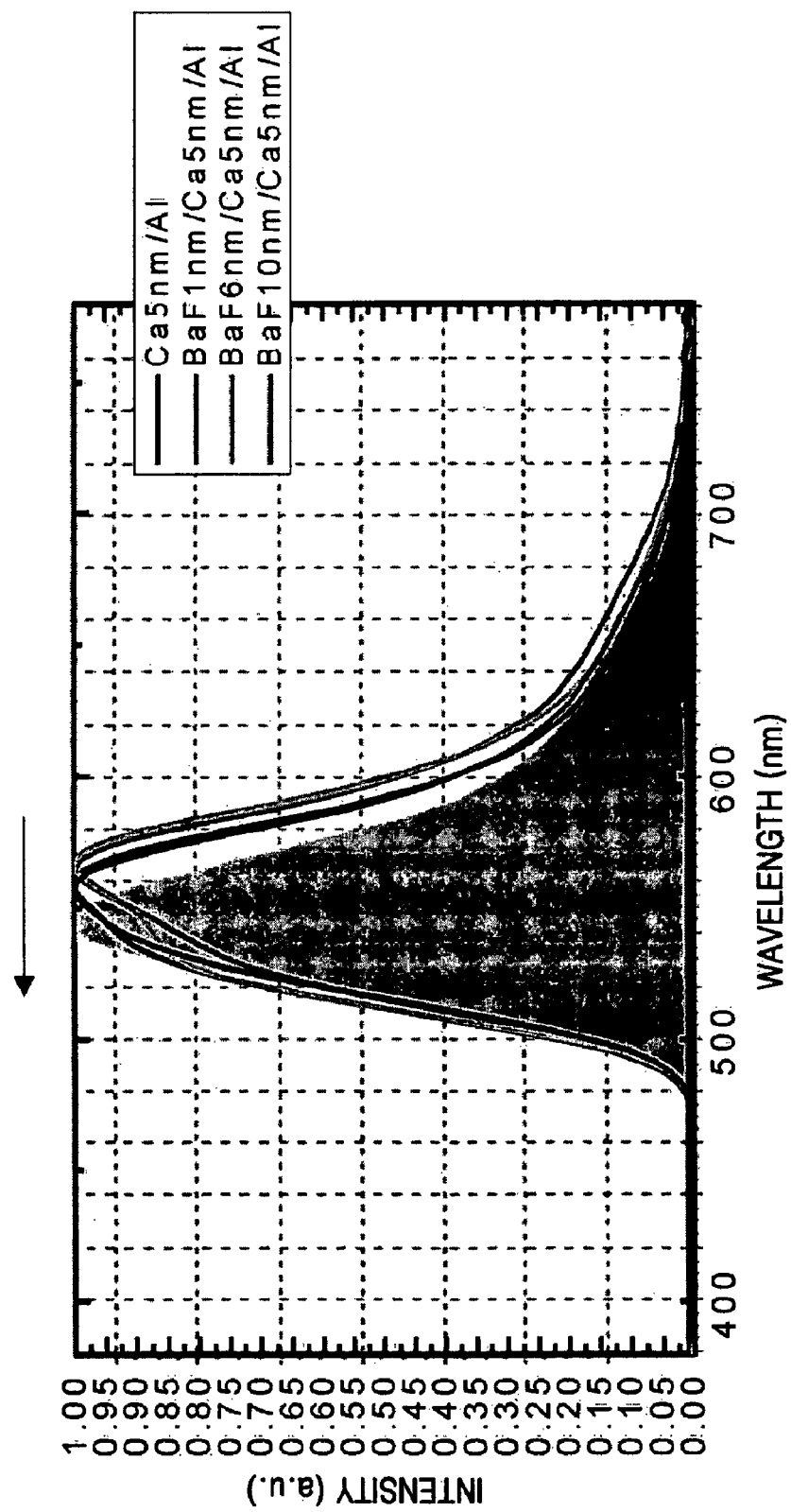
FIG. 13 is a graph of EL intensity of an OLED according to an embodiment of the present invention.

Color tuning of Samples 9 through 12 was measured using a SpectrScan PR650 which is a luminance testing device. The results are shown in FIG. 13. Referring to FIG. 13, colors of Samples 9 through 12 were shifted to a blue region regardless of the second electrode. As a result, the method according to the present invention can achieve color tuning, and thus, the modification of an organic material forming an emissive layer is not required.

An emissive layer of an OLED according to the present invention has greater a $n_o$–$n_e$ parameter than that of a conventional emissive layer. Accordingly, the OLED according to the present invention has long lifetime and high efficiency. Such an OLED can be manufactured using a method of manufacturing an OLED according to the present invention including multicoating.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light emitting device, the method comprising:
mixing a first electrically neutral emissive material in a first organic solvent to make a first mixed solution;
coating a substrate with the first mixed solution to form a first-coated layer;
mixing a second electrically neutral emissive material in a second organic solvent to make a second mixed solution;
coating the first-coated layer with the second mixed solution to form a second-coated layer, the first-coated layer being dissolved into the second organic solvent; and
heat-treating the substrate, on which the first-coated layer and the second-coated layer are formed, to form a single emissive layer, an $n_o$–$n_e$ parameter of the single emissive layer being greater than an $n_o$–$n_e$ parameter of the first-coated layer, where $n_o$ is an ordinary refractive index and $n_e$ is a extraordinary refractive index.

2. The method of claim 1, wherein the substrate is a first electrode.

3. The method of claim 1, wherein the substrate is a hole injection layer formed on a first electrode.

4. The method of claim 1, wherein each of the first and second neutral emissive materials comprises at least one compound selected from the group consisting of polyphenylenevinylene (PPV)-based polymer and a derivative thereof, a poly(p-phenylene) (PPP)-based polymer and a derivative thereof, a polythiophene(PT)-based polymer and a derivative thereof, a polyfluoroene(PF)-based polymer and a derivative thereof, and a polyspirofluorene (PSF)-based polymer and a derivative thereof.

5. The method of claim 1, wherein each of the first and second neutral emissive materials comprises at least one material selected from the group consisting of a blue emissive material having an energy band gap of 2.41 eV to 2.80 eV, a green emissive material having an energy band gap of 2.21 eV to 2.40 eV, and a red emissive material having an energy band gap of 1.90 eV to 2.20 eV.

6. The method of claim 1, wherein each of the first and second organic solvents comprises at least one organic solvent selected from organic solvents having a Hansen solubility parameter of 16 to 24.

7. The method of claim 6, wherein a hydrogen bonding component constant of the Hansen solubility parameter is in the range of 1 to 10.

8. The method of claim 1, wherein each of the first and second organic solvents is at least one of toluene, xylene, and chlorobenzene.

9. The method of claim 1, wherein a heat-treatment is not performed before the coating the first-coated layer with the second mixed solution.

10. The method of claim 1, wherein the first organic solvent has a smaller Hansen solubility parameter than the second organic solvent.

11. The method of claim 1, wherein a concentration of each of the first and second electrically neutral emissive materials is in the range of 0.3 wt % to 5.0 wt % based on the first and second mixed solutions, respectively.

12. The method of claim 1, further comprising:
mixing a third electrically neutral emissive material in a third organic solvent to make a third mixed solution; and
coating the second-coated layer with the third mixed solution to form a third-coated layer, the second-coated layer being dissolved into the third organic solvent.

13. The method of claim 12, wherein a heat-treatment is not performed before the coating the second-coated layer with the third mixed solution.

14. The method of claim 12, further comprising:
coating the first-coated layer with an organic solvent; and
coating the second-coated layer with another organic solvent.

15. The method of claim 1, further comprising coating the first-coated layer with an organic solvent.

16. The method of claim 1, further comprising heat-treating the first-coated layer before the coating the first-coated layer with the second mixed solution.

17. The method of claim 16, wherein the heat-treating the first-coated layer is performed at one or a combination of temperature ranges selected from the group consisting of a glass transition temperature of the coated first electrically neutral emissive material, a thermal decomposition temperature of the coated first electrically neutral emissive material, and a temperature between the glass transition temperature and the thermal decomposition temperature of the coated first electrically neutral emissive material.

18. The method of claim 16, wherein the heat-treating the first-coated layer is performed at 20° C. or between 20° C. and a glass transition temperature of the first electrically neutral emissive material.

19. The method of claim 1, wherein the first electrically neutral emissive material has a smaller energy band gap than the second electrically neutral emissive material.

20. The method of claim 1, wherein the first electrically neutral emissive material has a higher energy band gap than the second electrically neutral emissive material.

21. The method of claim 1, wherein the first electrically neutral emissive material is identical to the second electrically neutral emissive material.

22. The method of claim 1, wherein the mixture of the first electrically neutral emissive material and the first organic solvent is coated using at least one method selected from the group consisting of spin coating, dip coating, ink-jet printing, nozzle printing, spray coating, and roll coating.

* * * * *